US009488962B2

(12) United States Patent
Passilly et al.

(10) Patent No.: US 9,488,962 B2
(45) Date of Patent: Nov. 8, 2016

(54) ALKALI-METAL VAPOUR CELL, ESPECIALLY FOR AN ATOMIC CLOCK, AND MANUFACTURING PROCESS

(71) Applicants: CENTRE NATIONAL DE LA RECHERCHE SCIENTIFIQUE—CNRS, Paris (FR); UNIVERSITE DE FRANCHE COMTE, Besancon (FR)

(72) Inventors: Nicolas Passilly, Auxin-Dessus (FR); Christophe Gorecki, Pin (FR); Ravinder Chutani, Besancon (FR); Rodolphe Boudot, Trepot (FR)

(73) Assignees: Centre National de la Recherche Scientifique—CNRS, Paris (FR); Universite de Franche Comte, Besancon (FR)

( * ) Notice: Subject to any disclaimer, the term of this patent is extended or adjusted under 35 U.S.C. 154(b) by 0 days.

(21) Appl. No.: 14/435,113

(22) PCT Filed: Oct. 11, 2013

(86) PCT No.: PCT/FR2013/052432
§ 371 (c)(1),
(2) Date: Apr. 10, 2015

(87) PCT Pub. No.: WO2014/057229
PCT Pub. Date: Apr. 17, 2014

(65) Prior Publication Data
US 2015/0277386 A1    Oct. 1, 2015

(30) Foreign Application Priority Data

Oct. 12, 2012 (FR) ................................. 12 59783

(51) Int. Cl.
*H03L 7/26* (2006.01)
*G04F 5/14* (2006.01)
*C03B 11/14* (2006.01)
*C03C 15/00* (2006.01)

(52) U.S. Cl.
CPC ................ *G04F 5/14* (2013.01); *C03B 11/14* (2013.01); *C03C 15/00* (2013.01); *G04F 5/145* (2013.01); *H03L 7/26* (2013.01)

(58) Field of Classification Search
CPC .......... C03B 11/14; C03C 15/00; H03L 7/26; G04F 5/14; G04F 5/145
USPC ......................... 331/3, 94.1; 29/428; 250/345
See application file for complete search history.

(56) References Cited

U.S. PATENT DOCUMENTS

2007/0139128 A1  6/2007  Koyama
2007/0146085 A1  6/2007  Koyama

FOREIGN PATENT DOCUMENTS

JP       2007 178274 A      7/2007

OTHER PUBLICATIONS

French Search Report for related Application No. FR 12 59783; dated Sep. 18, 2013.
Wenlong Wei et al: "Fabrication of wafer-level spherical Rb vapor cells for miniaturized atomic clocks by a chemical foaming process", Electronic Packaging Technology and High Density Packaging (ICEPT-HPD), 2012 13$^{th}$ International Conference On, IEEE, Aug. 13, 2012, pp. 1639-1641, XP032339069, DOI: 10.1109/ICEPT-HPD.2012.6474922 ISBN: 978-1-4673-1682-8.

*Primary Examiner* — Arnold Kinkead
(74) *Attorney, Agent, or Firm* — Miller, Matthias & Hull LLP

(57) ABSTRACT

The invention relates to an alkali-metal vapor cell, especially for an atomic clock, and to its manufacturing process. The alkali-metal vapor cell is able to be associated with a laser for emitting an external input laser beam and a photodetector for receiving an external output laser beam, and comprises a housing having an upstream optical window and a downstream optical window and forming an optical cavity filled with an alkali-metal vapor such as a caesium-comprising vapor, and micro-optical means arranged in the optical cavity and comprising an upstream optical reflector and a downstream optical reflector for reflecting the laser beam, which reflectors are inclined relative to each other, the upstream reflector being inclined relative to the plane (P) of the upstream window and to the axis of the input laser beam so that the external input laser beam passes through the upstream window in order to form an internal input laser beam, the latter being reflected by the upstream reflector and deviated towards the downstream reflector so as to form an internal intermediate laser beam that is reflected on the downstream reflector and deviated towards the downstream window so as to form an internal output laser beam, the internal output laser beam passing through the downstream window in order to form the external output laser beam.

25 Claims, 12 Drawing Sheets

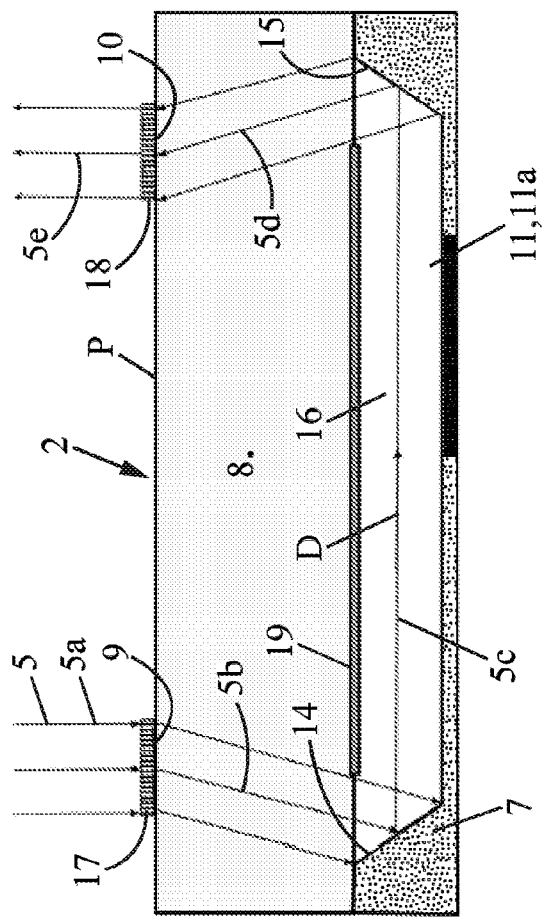
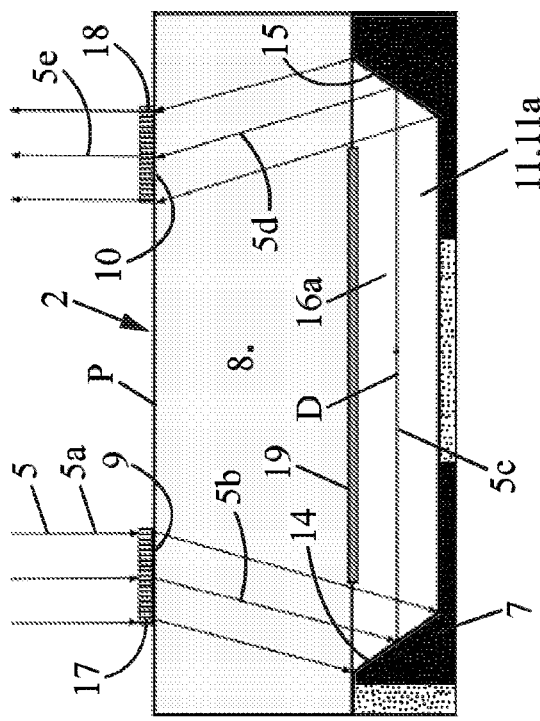
FIG. 3B
FIG. 3A

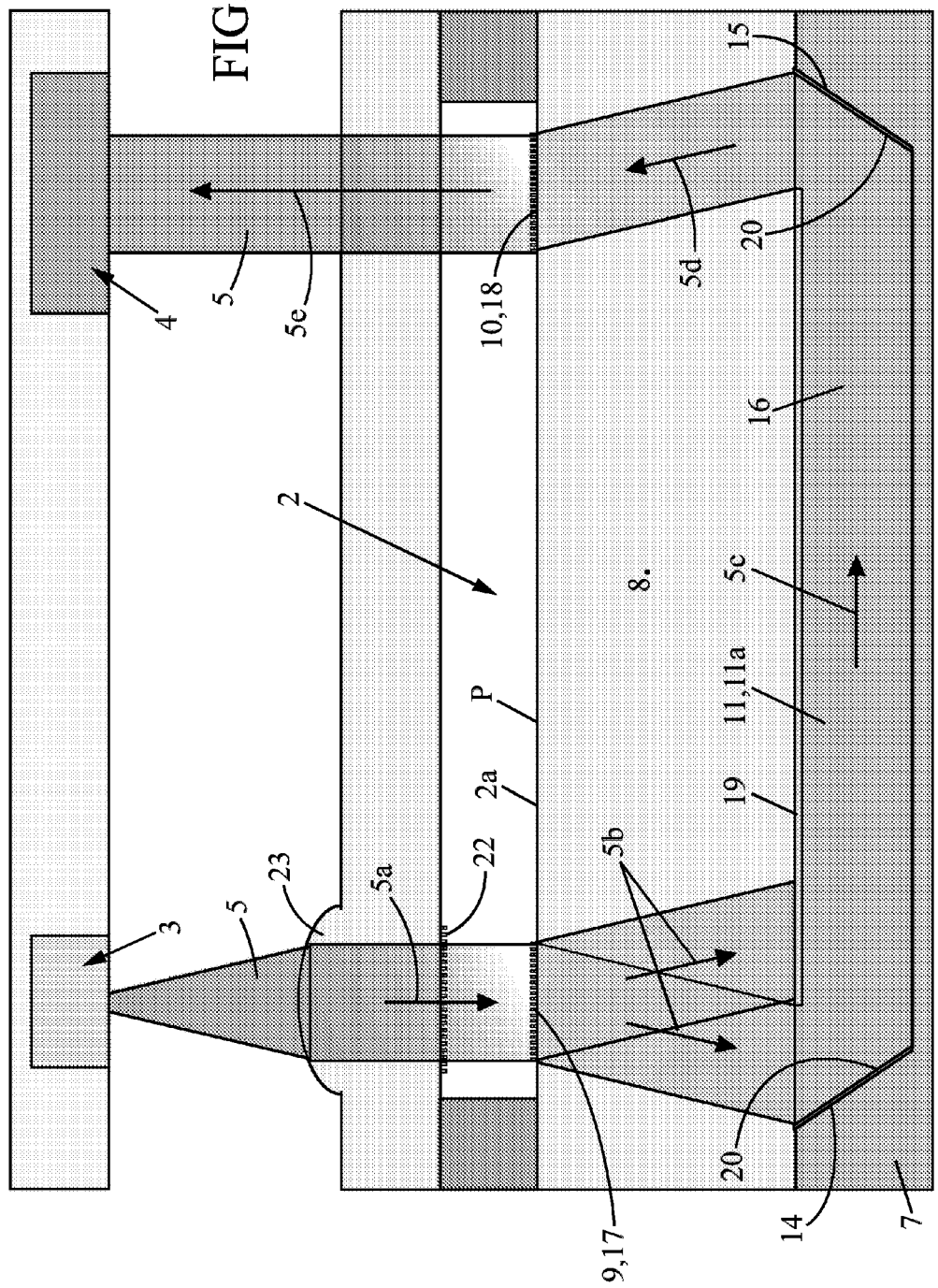

1

ALKALI-METAL VAPOUR CELL, ESPECIALLY FOR AN ATOMIC CLOCK, AND MANUFACTURING PROCESS

CROSS-REFERENCE TO RELATED APPLICATION

This Application is a 35 USC §371 US National Stage filing of International Application No. PCT/FR2013/052432 filed on Oct. 11, 2013, and claims priority under the Paris Convention to French Patent Application No. 12 59783 filed on Oct. 12, 2012.

FIELD OF THE DISCLOSURE

The invention relates to the field of gas cells and atomic clocks.

BACKGROUND OF THE DISCLOSURE

More specifically, the invention relates to the field of alkali-metal (cesium) cells which may be very small, for example having a volume of a few $cm^3$, for which a typical application is a chip-scale atomic clock known by the acronym CSAC. Such cells and atomic clocks are sometimes called "micro-cells" or "micro-clocks". Throughout the following text, the term "micro" is to be understood as having the context and meaning indicated.

Such micro-clocks are intended, for example, for use in telecommunications, navigation, and defense. But the alkali-metal vapour cells concerned can also be used in sensors such as micro-magnetometers and micro-gyroscopes.

The micro-clocks considered here are based on the principle of atomic resonance by coherent population trapping, known by the acronym CPT.

Research has yielded several CSAC prototypes since 2004, specifically in the context of the NIST program (acronym for National Institute of Standards and Technology). More recently, Symmetricom has commercially released the CSAC known as the SA 45s, which has a volume of 16 $cm^3$, weighs 35 g, and has a power consumption of only 120 mW As part of the MAC-TFC consortium, the FEMTO-ST Institute (acronym for Franche-Comté Electronique Mécanique Thermique et Optique—Sciences et Technologie) began work in 2008 on designing and building a very compact cesium vapour cell (a few $mm^3$) with MEMS (acronym for MicroElectroMechanical Systems) machining of silicon and anodic bonding. The cell is defined on the sides by a first glass cover and a second glass cover, spaced apart from one another and arranged parallel to one another. The cell forms a sealed vacuum cavity which is filled with cesium by making use of a locally heated alkali dispenser, which overcomes the problem of the conflict between the anodic bonding and the chemistry of cesium (see "New approach of manufacturing and dispensing of micromachined cesium vapor cell" of L. Nieradko, C. Gorecki, A. Douahi, V. Giordano, J. C. Beugnot, J. Dziuban, and M. Moraja published in the JOURNAL OF MICRO-NANO-LITHOGRAPHY MEMS AND MOEMS of August 2008). This cell has an architecture referred to as "transmissive", the laser, in this case a vertical cavity surface emitting laser known by the acronym VCSEL, and the photodetector (photodiode) being located one on either side of the cell itself, the laser beam traversing it from side to side, entering through the first glass cover and exiting through the second glass cover.

The prior art is also illustrated by documents EP 0550240, EP 2154586, EP 2362282, U.S. Pat. No. 6,265,945, U.S. Pat. No. 6,320,472, US 2002/0163394, US 2009/0251224, JP 2007 178273, and JP 2007 178274, which describe different arrangements which all have an architecture where the laser beam traverses the cell, as above.

Document US 2005/0046851 aims to provide CSACs that are more compact, less complex, and less expensive than existing ones. It describes an architecture in which the VCSEL and the photodetector are integrated and form an assembly located at the first end of the cell, while a flat reflective surface is provided at the second end of the cell, the two ends being planar, spaced apart from each other, and arranged parallel to one another. With this architecture, the VCSEL produces a diverging laser beam which passes through the cell a first time in order to reach the flat reflective surface, and then after reflection passes through the cell a second time in the opposite direction in order to reach the photodetector. This architecture has the disadvantage of requiring a diverging laser beam and of leading to two passes through the cell in two opposite directions.

There is therefore the need for gas cells (alkali-metal vapour cells) specifically designed for atomic clocks such as CSACs, having an architecture that improves their performance in terms of compactness, frequency stability, power consumption, and integration of clock components, and achieving this with an assembly process that is easier, more precise, and suitable for industrial scale production.

SUMMARY OF THE DISCLOSURE

A description of the invention as characterized in the claims is provided below.

According to a first aspect, the invention relates to an alkali-metal vapour cell, intended in particular for inclusion in an atomic clock, adapted to be associated with a laser for emitting an external input laser beam striking the cell and with a photodetector for receiving an external output laser beam exiting the cell, the laser beam having passed through the cell, said cell comprising, on the one hand, a housing having an upstream optical window and a downstream optical window and forming an optical cavity filled with an alkali-metal vapour such as a vapour containing cesium, and on the other hand, micro-optical means arranged in the optical cavity and comprising an upstream optical reflector and a downstream optical reflector for reflecting the laser beam, said reflectors being inclined relative to one another, the upstream reflector being inclined relative to the plane of the upstream window and to the axis of the input laser beam, such that: the external input laser beam passes through the upstream window to form an internal input laser beam, the internal input laser beam is reflected on the upstream reflector and deflected towards the downstream reflector to form an internal intermediate laser beam, the internal intermediate laser beam is reflected on the downstream reflector and deflected towards the downstream window to form an internal output laser beam, and the internal output laser beam passes through the downstream window to form the external output laser beam.

In one embodiment, the upstream reflector and the downstream reflector are arranged symmetrically relative to a transverse mid-plane of the cell.

In one embodiment, the input laser beam and/or output laser beam forms a 90° angle with the internal intermediate laser beam, and/or the input laser beam and the output laser beam are arranged parallel to one another.

In one embodiment, the upstream reflector and the downstream reflector are spaced apart from each other, the spacing between them determining the dimension of the optical cavity and of the cell along the axis of the internal intermediate laser beam.

In the embodiments, the spacing between the upstream reflector and the downstream reflector is chosen according to the strength of the CPT signal desired.

In one embodiment, the spacing between the upstream reflector and the downstream reflector is between about 3 mm and about 9 mm, particularly between about 4 mm and about 8 mm, more particularly between about 5 mm and about 7 mm.

In one embodiment, the upstream optical window and the downstream optical window are arranged on one and the same side of the cell, in particular are formed by two portions separated by one and the same glass plate—or wafer.

In one embodiment, the alkali-metal vapour cell comprises one and the same side of association with the laser emitting the input laser beam and with the photodetector receiving the output laser beam.

In one embodiment, the alkali-metal vapour cell also comprises upstream deflection means for deflecting the input laser beam, said means being located upstream of the upstream reflector, and, where appropriate, downstream deflection means for deflecting the laser beam reflected by the downstream reflector, said means being located downstream of the downstream reflector, so as to combine the deflection produced by the deflection means with the deflection produced by the associated reflector. In particular, the upstream deflection means, and where appropriate the downstream deflection means, are diffraction means associated with the upstream optical window and where appropriate with the downstream optical window.

In one embodiment, the reflectors and where appropriate the deflection means, in particular the diffraction means, are chosen so as to maintain the circular polarization state of the laser beam during its path.

In one embodiment, the alkali-metal vapour cell further comprises, in the optical cavity, one or more masks preventing the passage of the laser beam into unwanted area(s).

In one embodiment, the upstream reflector and the downstream reflector are formed by shaping, particularly by etching, a plate—or wafer, and comprise a reflective coating, particularly of metal, more particularly of aluminum.

In one embodiment, the alkali-metal vapour cell comprises, in addition to the optical cavity, a dispenser cavity adjacent to and in communication with the optical cavity, suitable for receiving a dispenser of alkali metal such as cesium, the alkali-metal vapour which is generated by heating after sealing the cell migrating towards and into the optical cavity through the communication between the two cavities.

In one embodiment, the optical cavity is filled with alkali-metal vapour and a buffer gas.

In one embodiment, the alkali-metal vapour cell has associated optical means for shaping the external input laser beam, in particular a quarter-wave plate and a collimating lens.

In one embodiment, the housing comprises, on the one hand, a shapeable plate—or wafer—shaped so as to form the recess of the optical cavity, the upstream reflector, the downstream reflector, if appropriate the recess of the dispenser cavity and the cleared area of the communication between the two cavities, and on the other hand, a glass plate—or wafer—so as to form the upstream optical window and the downstream optical window and to close off the optical cavity, where appropriate the dispenser cavity, and with which are associated, if appropriate, deflection means, in particular diffraction means, the glass plate—or wafer—and the recess-shaped plate—or wafer—being arranged opposite each other and sealed to one another, in particular by anodic bonding.

In one embodiment, the alkali-metal vapour cell comprises a recess-etched shapeable plate—or wafer, and the upstream reflector and downstream reflector are etched along the crystal planes of the component material of the shapeable plate—or wafer.

In one embodiment, the alkali-metal vapour cell comprises a shapeable silicon plate—or wafer, etched with a pyramid shape along the crystal planes [111] at 54.7° so as to form the upstream reflector, the downstream reflector, and the recess of the optical cavity and, in combination, upstream diffraction means for diffraction towards the adjacent outer edge of the cell and if appropriate downstream diffraction means with an angle of 19.48°.

According to a second first aspect, the invention relates to a method for manufacturing an alkali-metal vapour cell as just described, wherein:
- a shapeable plate—or wafer—is provided and is shaped to form a recess or recesses, in particular is etched, so as to form the recess of the optical cavity, the upstream reflector, the downstream reflector, if appropriate the recess of the dispenser cavity and the cleared area of the communication between the two cavities,
- a glass plate—or wafer—is provided that is suitable for forming the upstream optical window and the downstream optical window and for closing off the optical cavity, if appropriate the dispenser cavity,
- the recess-shaped plate—or wafer—and the glass plate—or wafer—are placed facing each other and are sealed to one another, in particular by anodic bonding,
- the optical cavity is filled with alkali-metal vapour,
- and, where appropriate, the glass plate—or wafer—is associated with deflection means, in particular diffraction means.

According to one embodiment of the method for manufacturing an alkali-metal vapour cell in question:
- an etchable silicon plate—or wafer—is provided, and is etched with a pyramid shape along the crystal planes [111] at 54.7° by wet etching so as to form the upstream reflector, the downstream reflector, and the recess of the optical cavity,
- the glass plate—or wafer—is associated with deflection means, in particular diffraction means.

According to one embodiment of the method for manufacturing an alkali-metal vapour cell in question, a dispenser cavity is formed, adjacent to and in communication with the optical cavity, a dispenser of alkali metal such as cesium is placed in the dispenser cavity, and once the recess-shaped plate—or wafer—and the glass plate—or wafer—are sealed to one another, heating is performed so as to generate alkali-metal vapour which migrates towards and into the optical cavity via the communication between the two cavities.

According to various embodiments of the method for manufacturing an alkali-metal vapour cell in question, this method comprises at least one of the following operations:
- placement of one or more masks in the optical cavity in order to prevent the passage of the laser beam into undesired area(s), placement on the upstream reflector and downstream reflector of a reflective coating, particularly of metal, more particularly of aluminum, introduction of a buffer gas into the optical cavity, association with the alkali-metal vapour cell of optical means for shaping the external input laser beam, in particular a quarter-wave plate and a collimating lens.

According to a third first aspect, the invention relates to an atomic clock comprising an alkali-metal vapour cell as described above, associated in a compact manner with a laser for emitting an external input laser beam striking the cell and with a photodetector for receiving an external output laser beam exiting the cell.

In one embodiment, the laser for emitting the input laser beam and the photodetector for receiving the output laser beam are associated with the cell on one and the same side of association.

In one embodiment, the input laser beam and the output laser beam are arranged parallel to one another, one next to the other.

In one embodiment, the laser is a VCSEL vertical cavity laser.

Compared to the prior art, the advantages of the invention are, for gas cells with alkali-metal (cesium) vapour and systems that incorporate them such as atomic clocks (CSACs), the improved performance in terms of compactness, frequency stability, power consumption, and integration of components for an assembly process that is easier, more precise, and suitable for industrial scale production.

BRIEF DESCRIPTION OF THE DRAWINGS

A brief description of the figures in the drawings is now provided.

In FIG. 1B the sectional view is along line BB of FIG. 1C, and in FIG. 1C the sectional view is along line CC of FIG. 1B. In these figures illustrating one physical implementation, the dispenser cavity is arranged in the extension of the width of the optical cavity.

FIGS. 3A and 3B show a purely schematic illustration of the upstream optical reflector and the downstream optical reflector and the spacing between them, as well as the laser beam, to demonstrate the possibility of varying the spacing between the upstream and downstream reflectors according to the strength of the CPT signal desired

FIG. 8 is a transverse cross-sectional diagram illustrating, with the laser beam, the glass plate—or wafer—of the cell with upstream deflection (diffraction) means and downstream deflection (diffraction) means, and optical means for shaping the external input laser beam, namely a quarter wave plate and a collimating lens.

FIG. 9A more specifically illustrates the creation of the cell itself. FIG. 9B the diffraction grating, and FIG. 9C their assembly.

DETAILED DESCRIPTION OF THE DISCLOSURE

The following is a detailed discussion of several embodiments of the invention, with examples and with reference to the drawings.

Figure 2:
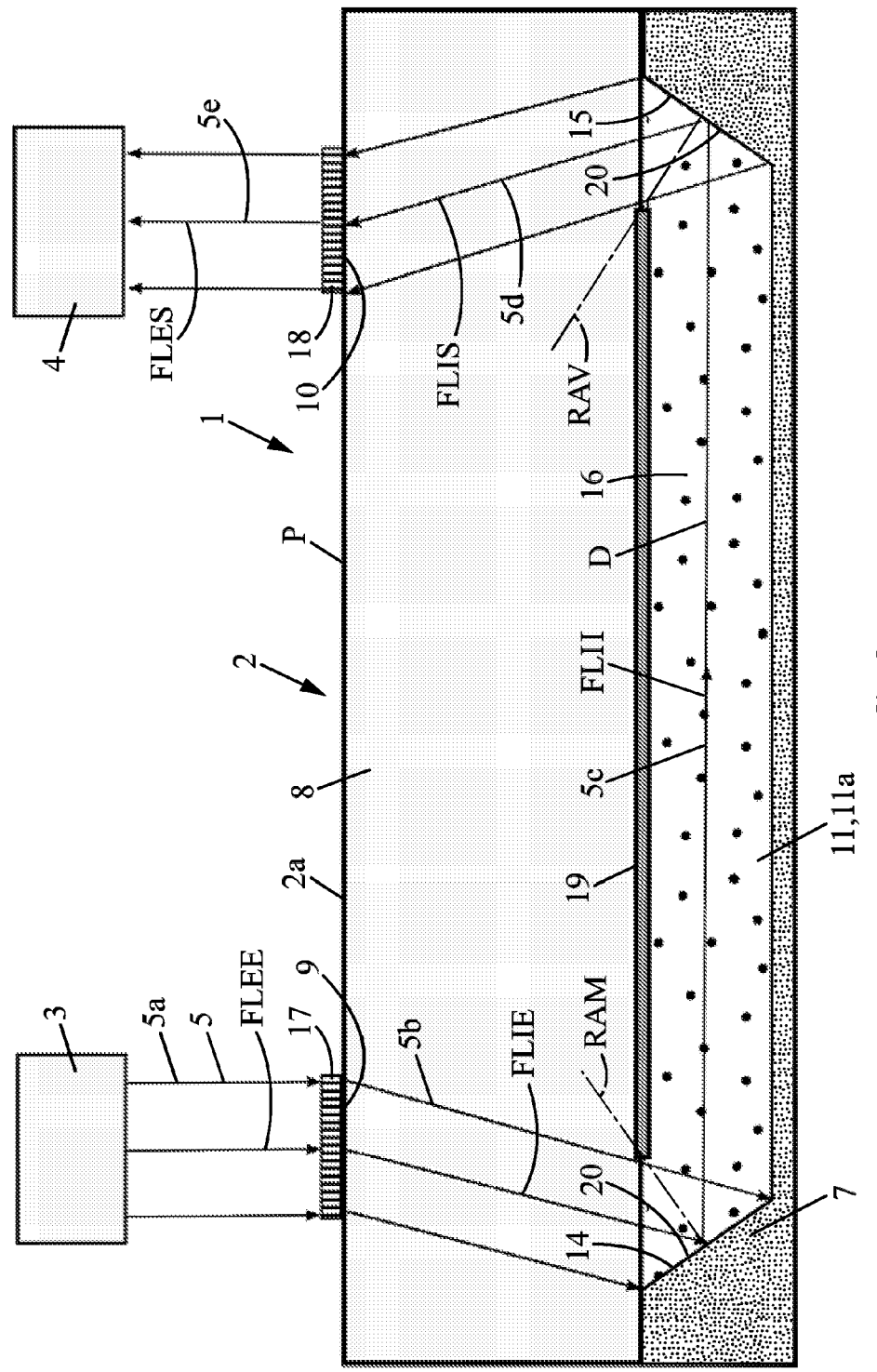
FIG. 2 is a transverse cross-sectional diagram illustrating a CSAC atomic clock according to the invention, comprising an alkali-metal (cesium) vapour gas cell of the invention, a laser and photodetector associated with the cell, and the path of the laser beam which traverses the cell during operation.

A chip-scale atomic clock 1 (CSAC) based on the principle of atomic resonance by coherent population trapping (CPT) is schematically represented in FIG. 2, and comprises an alkali-metal (cesium) vapour cell 2 with which are associated a laser 3 for emitting an external input laser beam striking the cell 2, here a vertical cavity surface emitting laser (VCSEL), and a photodetector 4 for receiving the external output laser beam exiting the cell 2. The laser beam is denoted with the reference 5.

Figure 1A:
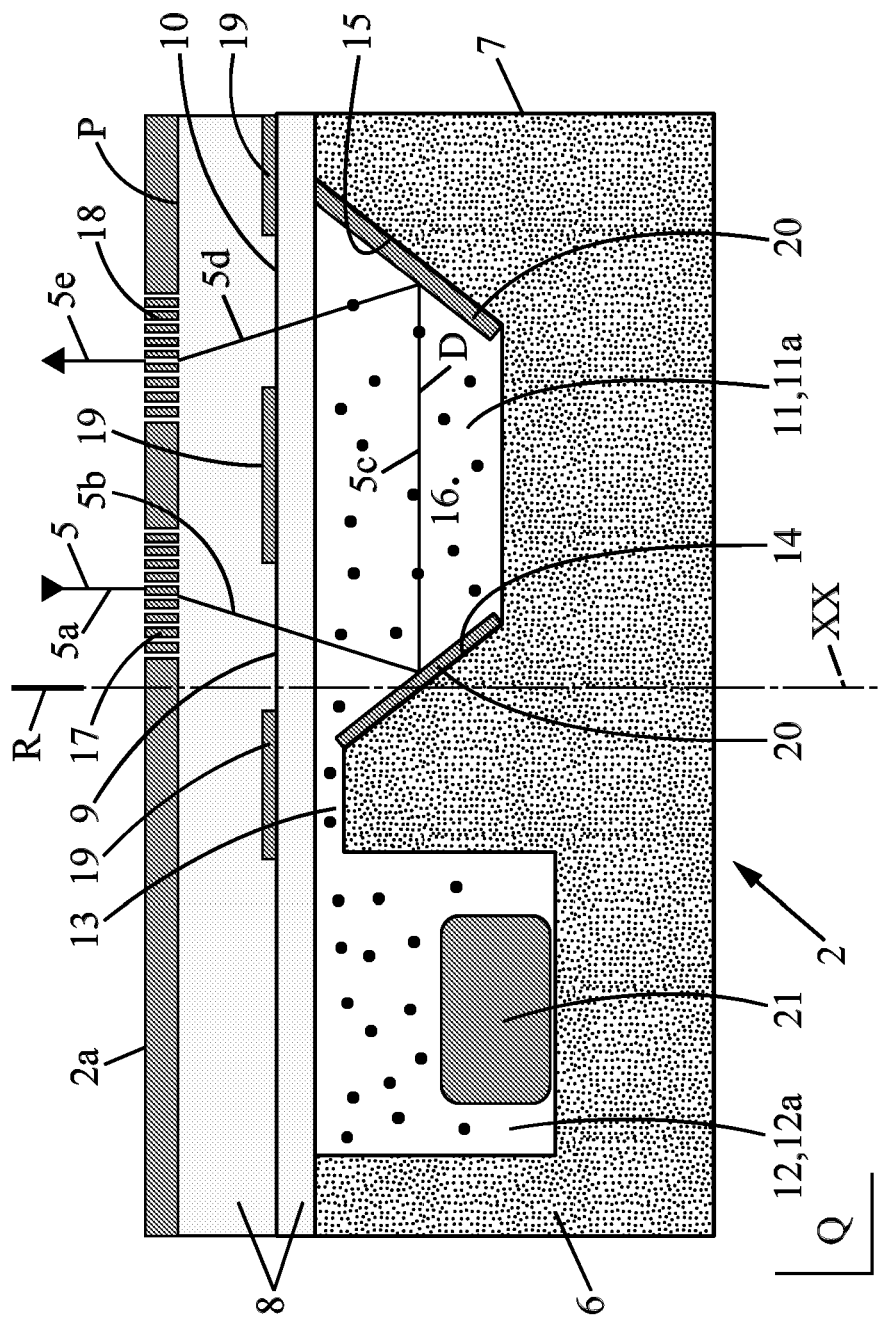
FIG. 1A is a diagram corresponding to a transverse cross-section provided solely for explaining the principles of a gas cell with alkali-metal (cesium) vapour according to the invention in the case where it comprises a dispenser cavity, while the laser and photodetector to be associated with the cell are not shown, nor is the laser beam which traverses the cell during operation. The diagram specifically illustrates the upstream optical window, the downstream optical window, the optical cavity filled with alkali-metal vapour, the upstream optical reflector and the downstream optical reflector having a reflective coating, and the upstream optical window and downstream optical window arranged on one and the same side of the cell, diffraction means being associated with the upstream optical window and downstream optical window. In this diagram, the dispenser cavity is arranged (in a deliberately contrived manner) within the extension of the length of the optical cavity, to allow showing the dispenser cavity, the optical cavity, and the deflection of the laser beam all in the same diagram
Figure 1B:
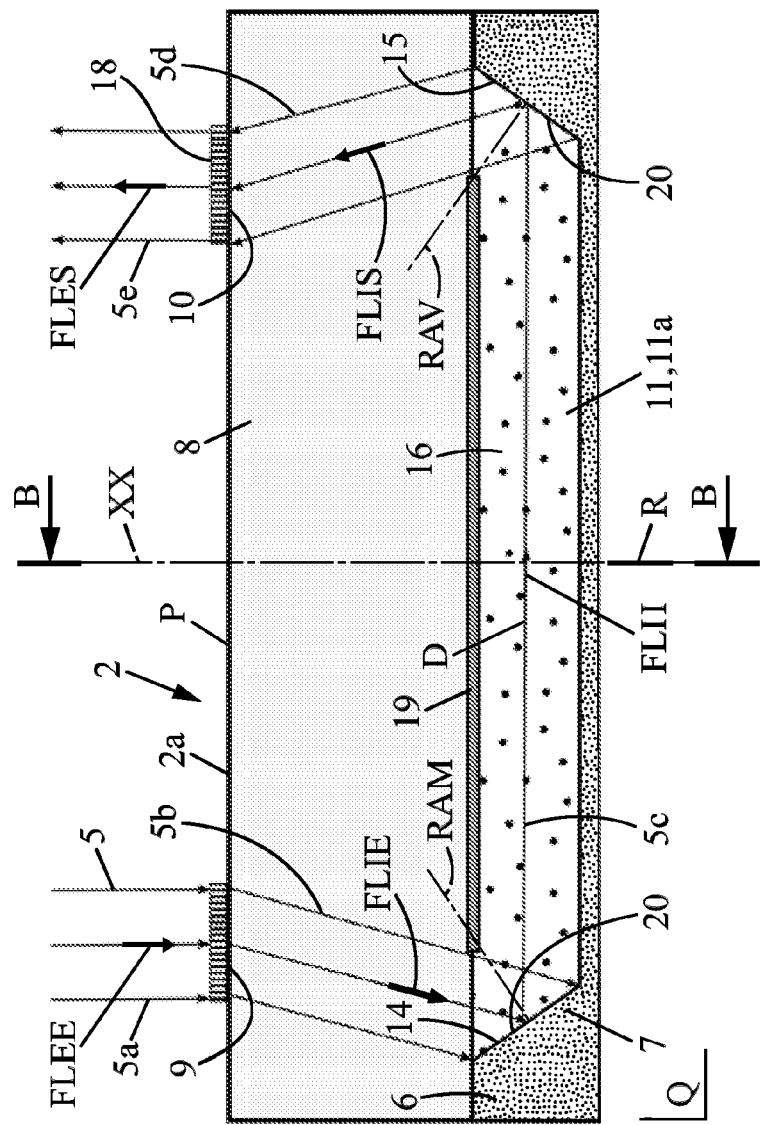
FIGS. 1B and 1C are two sectional views along two perpendicular planes, illustrating a possible physical implementation of a cell having a dispenser cavity, the upstream optical reflector and the downstream optical reflector being formed by etching a plate—or wafer—and arranged symmetrically.
Figure 1C:
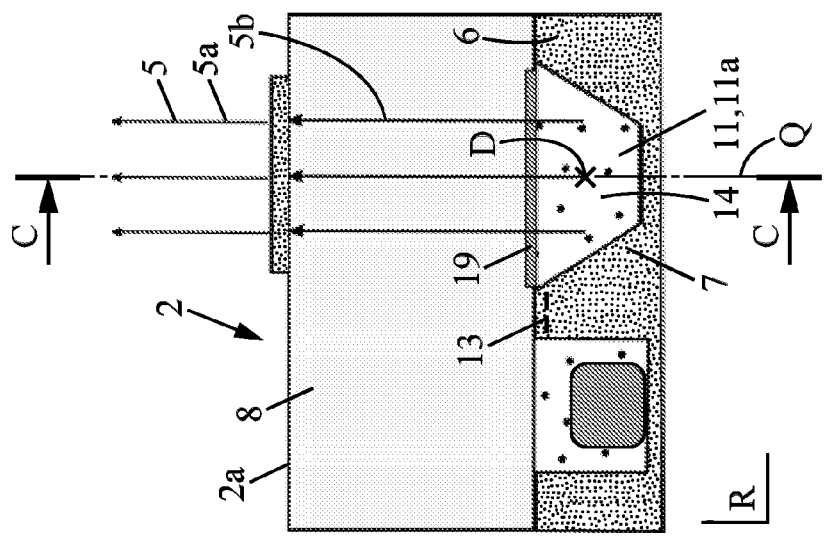

As indicated, the diagram of FIG. 1A allows explaining the principles of the cell 2, while FIGS. 1B and 1C represent such a cell 2 in a possible embodiment.

The cell 2 comprises a housing 6. The housing 6 includes a plate—or wafer—7, referred to as a "shapeable plate—or wafer—7" or "recess-shaped plate—or wafer—7" depending on whether referring to the original unshaped state or the shaped state, given that it will be shaped so as to have a recess or recesses as described. The housing 6 also comprises a glass plate—or wafer—8 which is formed of a single plate or of a plurality of superposed plates.

The recess-shaped plate—or wafer—7 and the glass plate—or wafer—8 are arranged facing each other and against each other.

They are sealed together in a secure and fluidtight manner, in particular by anodic bonding The housing 6 (and therefore by extension the cell 2) may have a parallelepiped or cylindrical outer shape or some other shape. It is generally flat and compact, having a volume which may be on the order of a cm$^3$ or a few cm$^3$. It has an axis XX, and two perpendicular transverse planes, namely a first transverse plane Q which is the plane of FIG. 1C (and the mid-plane of the optical cavity 11) and a second transverse central plane R which is the plane of FIG. 1B.

The cell 2 thus comprises an upstream optical window 9 and a downstream optical window 10 arranged on one and the same side of the cell 2 and formed by two portions separated from one another by the glass plate—or wafer—8.

Furthermore, the cell 2 forms an optical cavity 11 which is filed with alkali-metal vapour such as a vapour containing cesium and if appropriate a buffer gas.

According to a possibility illustrated by the block diagram of FIG. 1A and by the physical implementation of FIGS. 1B and 1C, which does not exclude other implementations, the cell 2 comprises, in addition to the optical cavity 11, a dispenser cavity 12 adjacent to the optical cavity 1 and in communication with it via a communication 13 As indicated, purely to illustrate the principles of the cell 2, the dispenser cavity 12 is represented in the diagram of FIG. 1A as placed in the extension of the length of the optical cavity 11. However, in the physical implementation of the cell 2 as illustrated by FIGS. 1B and 1C, the dispenser cavity 12 is actually placed in the extension of the width of the optical cavity 11.

Figure 5A:
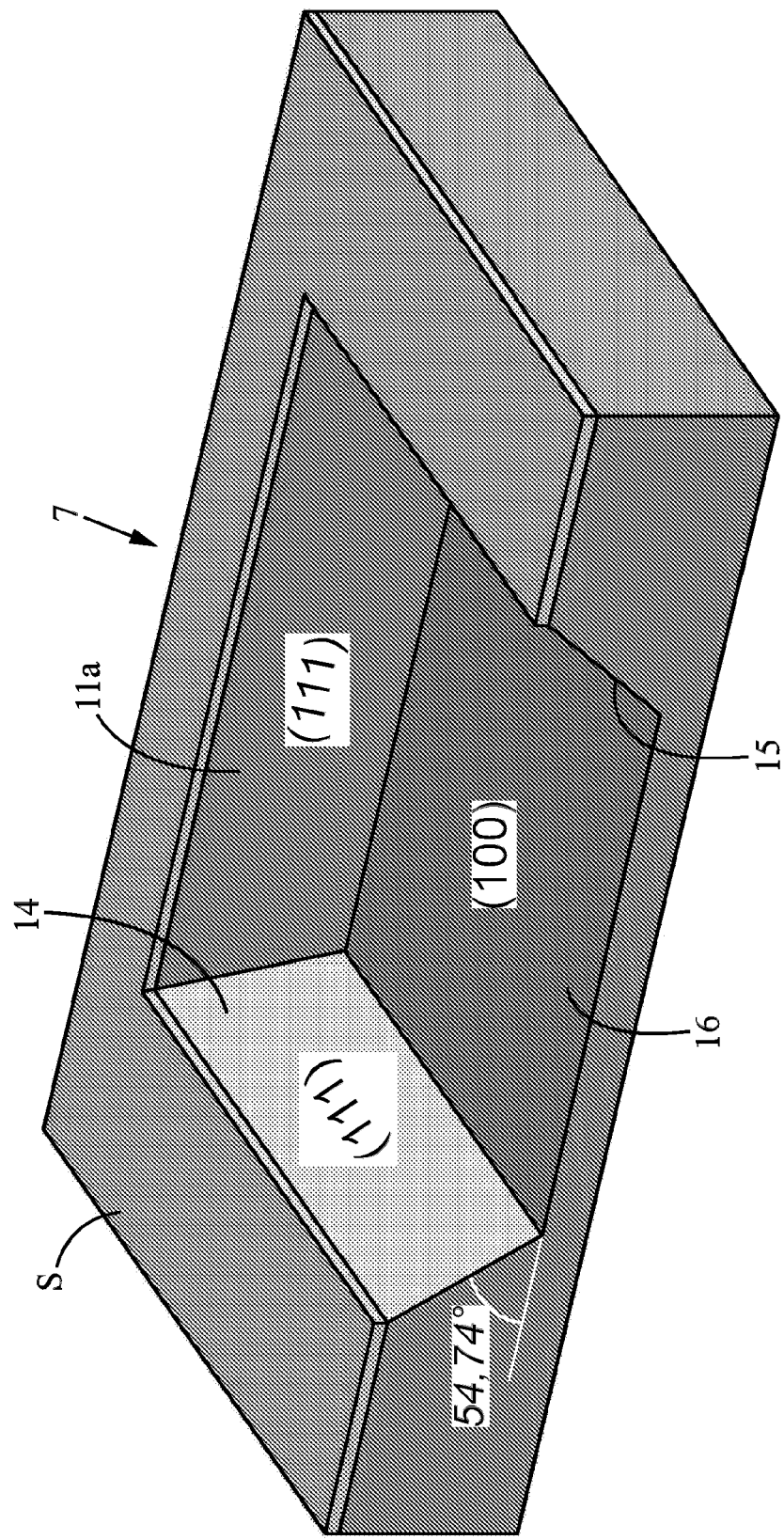
FIG. 5A is a schematic perspective view of the plate—or wafer—of FIG. 4, illustrating the pyramidal recessed etching along the crystal planes [111].
Figure 5B:
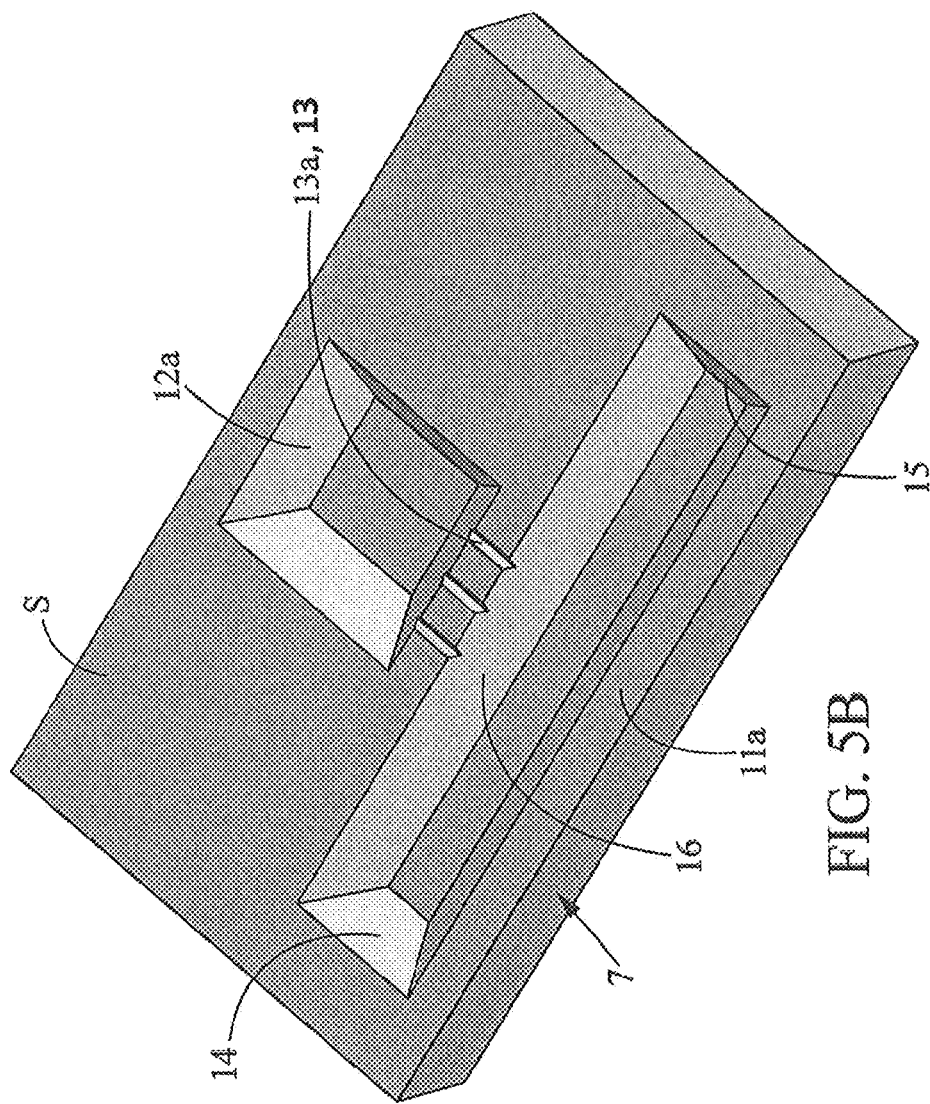
FIG. 5B is a perspective diagram of the plate—or wafer—of FIG. 4, illustrating the etched recesses of the optical cavity, of the dispenser cavity, and of the cleared communication area.
Figure 9A:
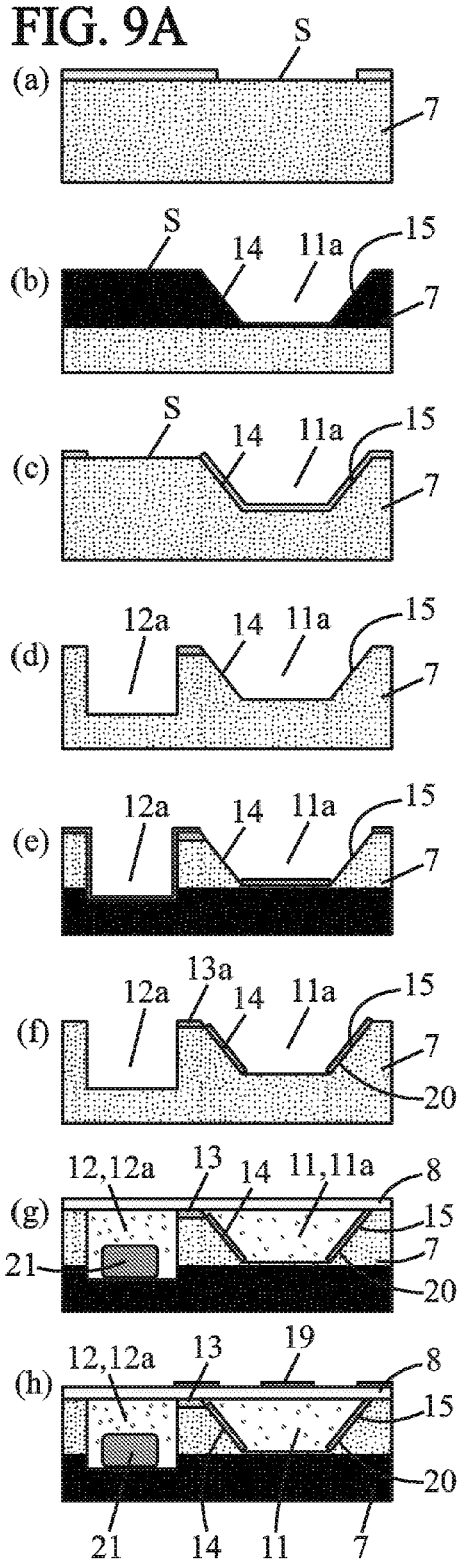
FIGS. 9A, 9B, and 9C illustrate the successive steps of a method for producing a cell such as the one represented in FIG. 1A.

Thus, as illustrated by FIGS. 5A and 5B and in particular in diagrams (b), (d), and (e) of FIG. 9A, the recess-shaped plate—or water—7 comprises a recess 11a for the optical cavity 11, and in the embodiment shown but not exclusively, a recess 12a for the dispenser cavity 12. It also comprises a cleared area 13a for the communication 13. The recess 11a, the possible recess 12a, and the possible cleared area 13a are understood to be relative to a front base plane S of the plate—or wafer—7 onto which the glass plate—or wafer—8 is applied.

The cell 2 also comprises micro-optic means arranged in the optical cavity 11.

These micro-optic means comprise an upstream optical reflector 14 and a downstream optical reflector 15.

These two optical reflectors 14 and 15 are planar

They are associated with the laser beam 5 which they deflect.

The terms "upstream" and "downstream" refer to the direction of the laser beam.

The two optical reflectors 14 and 15, of respective axes RAM and RAV perpendicular to their planes, are inclined relative to one another, and this is to be understood as meaning that the axes RAM and RAV of the optical reflectors 14 and 15 are inclined relative to one another In the embodiment represented, the angle between the two axes RAM and RAV is 70.5°.

The upstream optical reflector 14 is inclined relative to both the plane P of the upstream optical window 9 (and thus of the glass plate—or wafer—8) and the axis FLIE of the internal input laser beam 5 within the cell 2.

The laser beam, denoted in general by reference number 5, comprises several successive sections from upstream to downstream between the laser 3 and the photodetector 4. These sections are external input laser beam (section) 5a between the laser 3 and the upstream window 9, of axis FLEE, internal input laser beam (section) 5b between the upstream window 9 and the upstream reflector 14, of axis FLIE, internal intermediate laser beam (section) 5c between the upstream reflector 14 and the downstream reflector 15, of axis FLII, internal output laser beam (section) 5d between the downstream reflector 15 and the downstream window 10, of axis FLIS, external output laser beam (section) 5e between the downstream window 10 and the photodetector 4, of axis FLES.

In the text, the term "laser beam" is used instead of the expression "laser beam section," for readability.

The upstream optical reflector 14 and the downstream optical reflector 15 are inclined relative to each other, the upstream reflector 14 is inclined relative to the plane P of the upstream window 9 and to the axis FLIE of the internal input laser beam 5b, the downstream reflector 15 is inclined relative to the plane P of the downstream window 10, such that:

the internal input laser beam 5b is reflected on the upstream reflector 14 and deflected towards the downstream reflector 15, the internal intermediate laser beam 5c is reflected on the downstream reflector 15 and deflected towards the downstream window 10, the internal output laser beam 5d passes through the downstream window 10.

Thus, it is the desired path of the laser beam 5 and the relative positions of its constituent sections which determine the position of the optical reflectors 14 and 15 relative to each other and to the optical windows 9 and 10.

In the embodiment shown, the upstream reflector and downstream reflector are arranged symmetrically with respect to the second transverse mid-plane R of the cell 2, meaning that their axes RAM and RAV are also symmetrical to this plane.

In the embodiment shown, the upstream reflector and downstream reflector are arranged so that the external input laser beam 5a or the internal input laser beam 5b, and, the external output laser beam 5e or the internal output laser beam 5d, form a 90° angle with the internal intermediate laser beam 5c.

In addition, in the embodiment represented, the upstream reflector 14 and the downstream reflector 15 are arranged so that the external input laser beam 5a and the external output laser beam 5e are arranged parallel to one another. The atomic clock 1 is therefore such that the external input laser beam 5a and the external output laser beam 5e are arranged parallel to one another, one beside the other, with a spacing which corresponds to the spacing 16 between the upstream reflector 14 and the downstream reflector 15.

It is understood that the angle of one laser beam 5 relative to another, as well as their parallelism, is to be considered to be the angle or the parallelism of the axes of the laser beam sections.

With the architecture of the cell 2 as described, the upstream reflector 14 and the downstream reflector 15 are spaced apart from each other in the optical cavity 11, by the spacing 16 of direction D that is parallel to axis FLII of the internal intermediate laser beam This spacing 16 is selected according to the strength of the CPT signal desired.

Depending on requirements and in some possible embodiments, the spacing 16 is between about 3 mm and about 9 mm. More particularly, it may be between about 4 mm and about 8 mm. Even more particularly, it may be between about 5 mm and about 7 mm.

Figure 4:
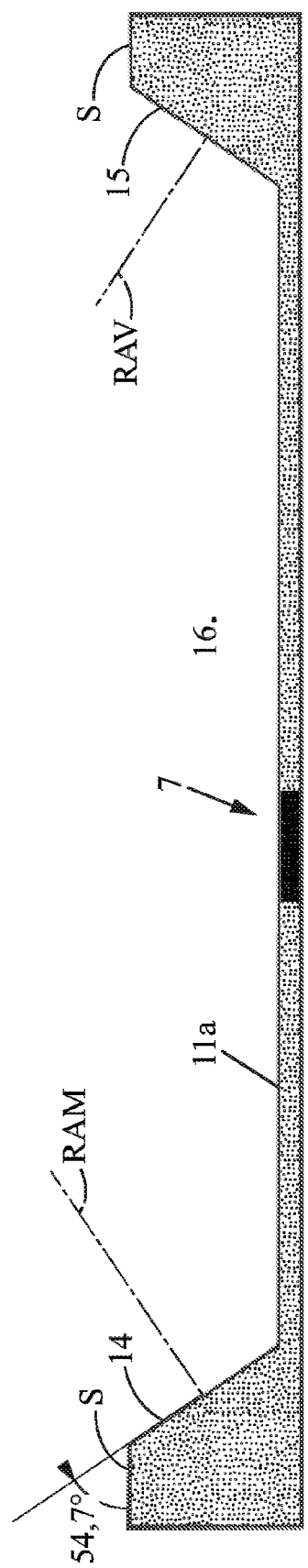
FIG. 4 is a transverse cross-sectional diagram illustrating a recess-shaped plate—or wafer—so shaped to form the recess of the optical cavity, the upstream reflector, and the downstream reflector.

With the architecture described, the cell 2 comprises one and the same side 2*a* of association with the laser 3 and with the photodetector 4, namely the side of the glass plate—or wafer—8, or opposite the side where the recess-shaped plate—or wafer—7 is located. Thus, the atomic clock 1 is such that the laser 3 emitting the external input laser beam 5, 5*a* and the photodetector receiving the external output laser beam 5*e* are associated with the cell on one and the same side 2*a* of said cell, namely the side of the glass plate—or wafer—8, or opposite the side where the recess-shaped plate—or wafer—7 is located In an embodiment represented in the figures (particularly FIGS. 4, 5A, and 5B, and diagrams (b), (c), and (d) of FIG. 9A), the shapeable plate—or wafer—7 is shaped so as to form the recess 11*a* of the optical cavity 11, the upstream reflector 14, the downstream reflector 15, if appropriate the recess cavity 12*a* of the dispenser 12, and a cleared area 13*a* suitable for forming the communication 13 between the two cavities 11 and 12.

More specifically, the upstream reflector 14 and the downstream reflector 15 are etched along chosen crystal planes of the constituent material of the shapeable plate—or wafer—7.

In the case of a silicon plate—or wafer—7, this may be etched with a pyramidal shape starting from its front base plane 5, as represented in FIG. 5, along the crystal planes [111]. Such crystal planes are inclined 54.7° relative to plane S. In this manner the upstream reflector 14 and downstream reflector 15 are formed having the inclination of the crystal planes [111].

It is understood that the invention is not limited to this embodiment of the reflectors 14 and 15.

With such an embodiment, the upstream reflector 14 and downstream reflector 15, or their planes, are not inclined 45° relative to plane S and 90° relative to one another, such that the path of the laser beam 5 cannot be the one described.

Figure 6:
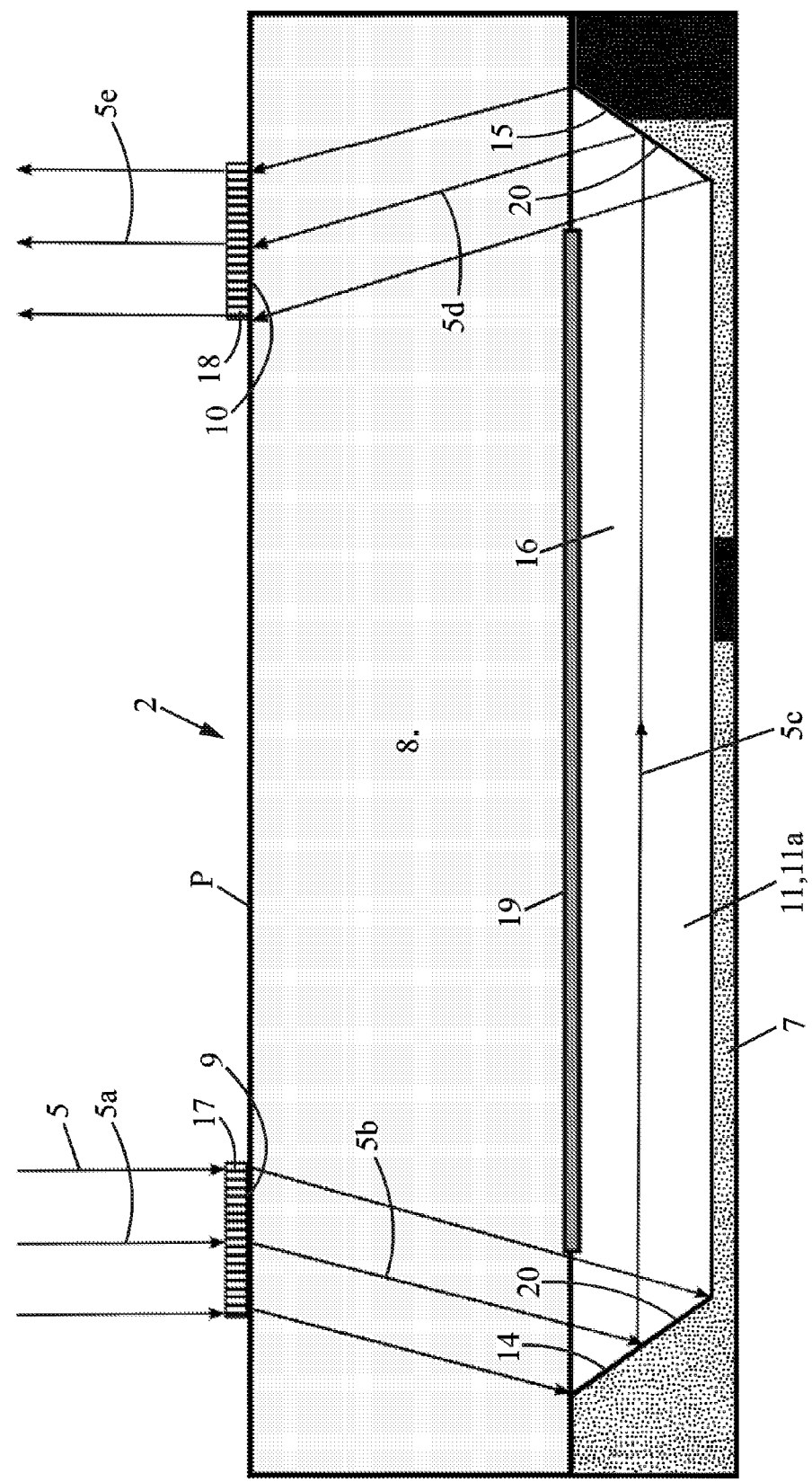
FIG. 6 is a transverse cross-sectional diagram illustrating, with the laser beam, the upstream optical reflector and the downstream optical reflector combined with upstream deflection means for deflecting the input laser beam, located upstream of the upstream reflector, and downstream deflection means for deflecting the laser beam reflected by the downstream reflector, located downstream of the downstream reflector, such that the deflection produced by the deflection means is combined with the deflection produced by the associated reflector.

Therefore, with this embodiment, it is arranged so that, as represented in the figures and particularly in FIG. 6, the cell 2 also comprises upstream deflection means 17 for deflecting the external input laser beam 5*a*, located upstream of the upstream reflector 14

Figure 9B:
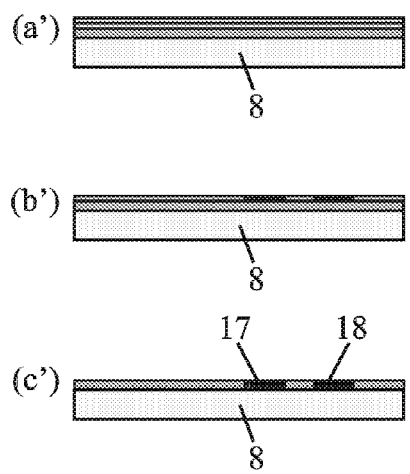

For reasons of symmetry, it is also arranged so that, also as shown in the figures and particularly in FIG. 6, as well as in diagrams (b') and (b'') of FIG. 9B, the cell 2 comprises downstream deflection means 18 for deflecting the internal output laser beam 5*d* located downstream of the downstream reflector 15.

With this arrangement, the deflection produced by the deflection means 17 and 18 is combined with the deflection produced by the respective associated reflector 14 and 15.

In one embodiment, the deflection means 17, 18 are diffraction means associated with the upstream, downstream optical window 9, 10.

These diffraction gratings are determined according to the geometry of the laser beam 5, which is dependent on that of the reflectors 14 and 15.

Thus, in the case of a cell 2 comprising a silicon plate—or wafer—7 etched along the crystal planes [111] at 54.7°, upstream diffraction means 17 for diffraction towards the adjacent outer edge of the cell 2 with an angle of 19.48° are provided. As indicated, for reasons of symmetry, downstream means 18 are also provided for diffraction towards the adjacent outer edge of the cell 2 with an angle of 19.48°.

In addition, the reflectors 14 and 15, and where appropriate the deflection/diffraction means 17 and 18, are chosen so as to maintain the circular polarization state of the laser beam 5 during its path.

Figure 7A:
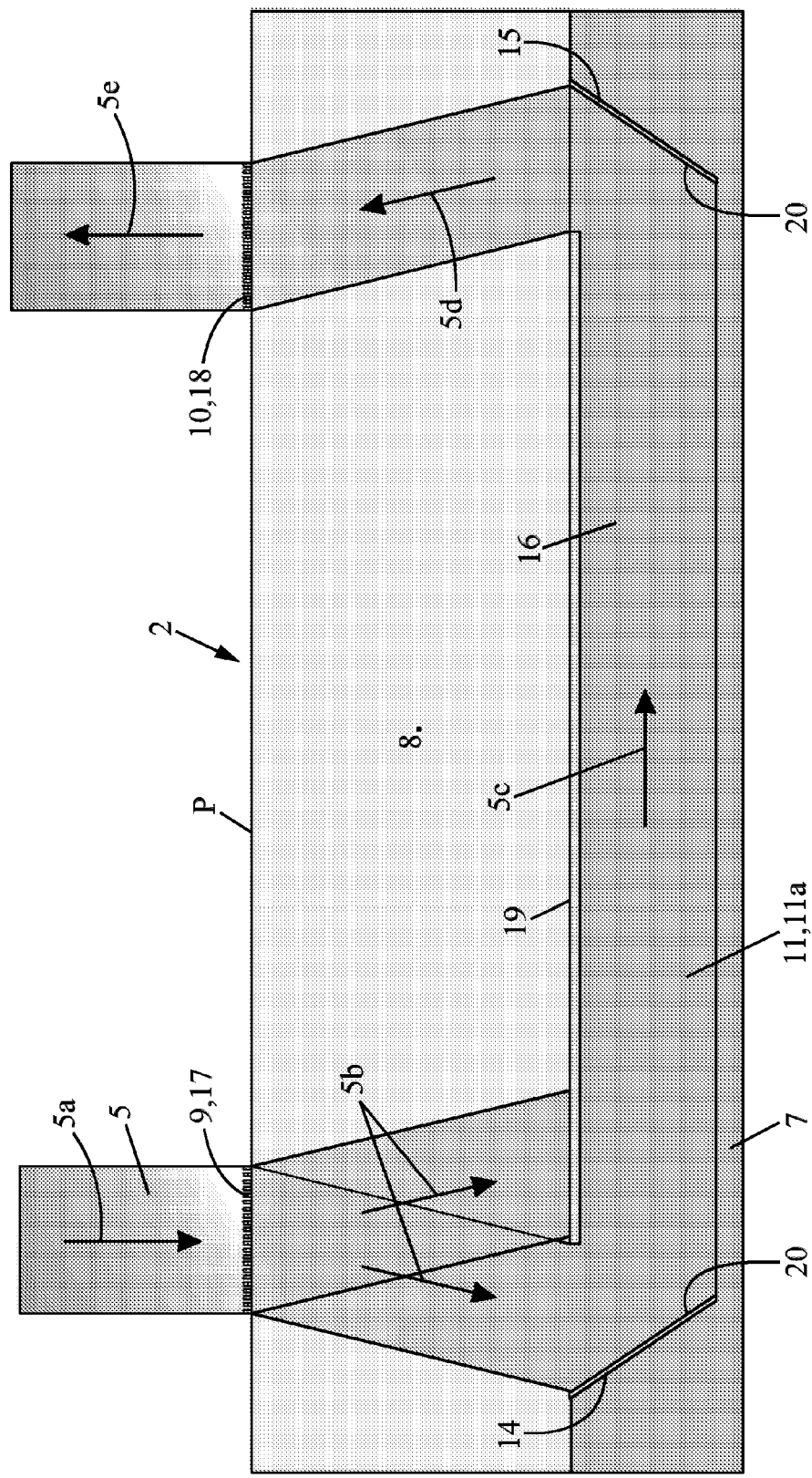
FIGS. 7A and 7B are analogous cross-sectional diagrams illustrating, with the laser beam, the upstream optical reflector and the downstream optical reflector in combination with masks preventing the passage of the laser beam into unwanted area(s).
Figure 7B:
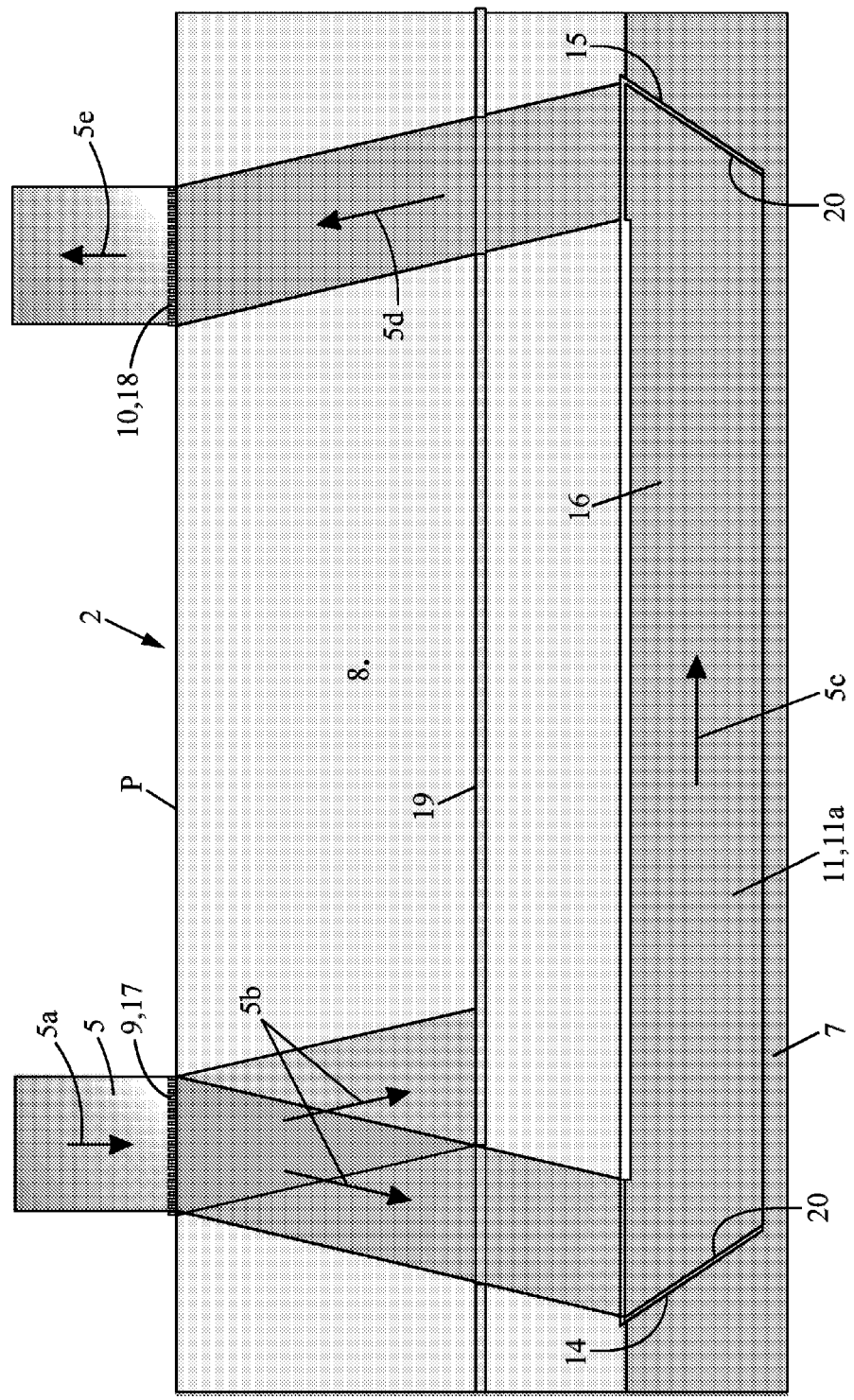

In some embodiments, as represented in FIGS. 7A and 7B and in diagram (b) of FIG. 9A, it is provided that the cell 2 also comprises, in the optical cavity 11, one or more masks 19 to prevent the passage of the laser beam or 5 into unwanted area(s). In some embodiments, such masks 19 are positioned at the reflectors 14 and 15 (FIG. 7A) or are distanced from them in the axial direction XX (FIG. 7B)

In some embodiments, as represented in FIGS. 1A and 2 and in diagram (f) of FIG. 9A, it is provided that the upstream reflector 14 and downstream reflector 15 comprise a reflective coating 20, particularly of metal and more particularly of aluminum, although this embodiment does not exclude others.

As indicated, the recess-shaped plate—or wafer—7 may, according to one possibility illustrated in the block diagram in FIG. 1A, in the physical implementation in FIGS. 1B and 1C and diagrams (d), (e), and (f) of FIG. 9A, comprise a recess 12*a* so that the cell 2 provides a dispenser cavity 12. This dispenser cavity 12 is adapted to receive, and receives, a dispenser 21 of alkali metal such as cesium (see diagram (g) of FIG. 9A). As shown in FIGS. 1B and 5B, the dispenser cavity 12 is arranged in the extension of the width of the optical cavity 11, meaning that it extends parallel to direction D, in particular in the middle portion of the length of the cell 2 and of the housing 6, along direction D, being offset from the optical reflectors 14 and 15.

With this arrangement, the alkali-metal vapour is generated by heating after the cell 2 is sealed, and migrates towards and into the optical cavity 11 via the communication 13 between the two cavities 12 and 11.

As illustrated in FIG. 5B, the communication 13 is positioned in the middle portion of the length of the cell 2 and of the housing 6, along direction D, being offset from the optical reflectors 14 and 15 The block diagram of FIG. 1A artificially shows the communication 13 as being near the upstream optical reflector 14, while in the physical implementation illustrated in FIGS. 1B and 1C the communication 13 is located in the middle portion of the length of the cell 2 and housing 6, along direction D, being offset from the optical reflectors 14 and 15, as is the dispenser cavity 12.

Such a design of a cell with its dispenser received in a dispenser cavity is known from the prior art and is within the reach of the skilled person.

It is understood that the invention is not limited to this mode of filling the optical cavity 11.

In one embodiment, as represented in FIG. 8, it is provided that the cell 2 is associated with optical means for shaping the external input laser beam 5*a*, in particular a quarter-wave plate 22 and a collimating lens 23.

The invention relates to the cell 2 as described above, the atomic clock 1 which comprises this cell 2, and also the method for manufacturing such a cell 2.

Figure 9C:
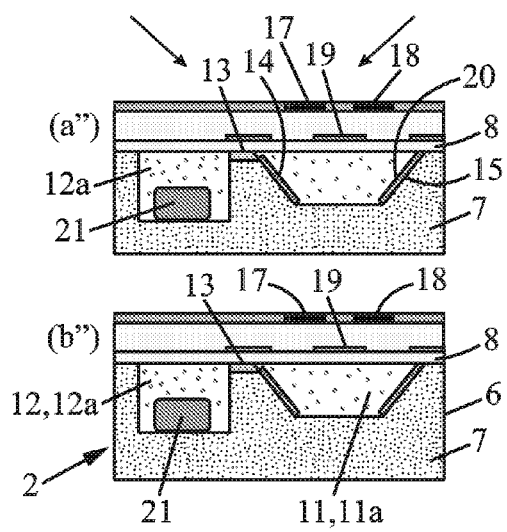

This method, which is not exclusive of other methods, is illustrated by FIGS. 9A, 9B, and 9C.

As illustrated by the successive diagrams (a) to (f) of FIG. 9A, illustrating the successive steps of the method, a shapeable plate—or wafer—7 is provided which is shaped to form a recess or recesses, in particular it is etched to form the recess 11*a* of the optical cavity 11, the upstream reflector 14, the downstream reflector 15, and if appropriate the recess 12*a* of the dispenser cavity 12 and the cleared area 13*a* of the communication 13 between the two cavities 11, 12. If appropriate, the recess 12*a* of the dispenser cavity 12 and the cleared area 13*a* can be made by dry etching, differently from the creation of the recess 11*a* of the optical cavity 11.

In some embodiments, the method also comprises the introduction of one or more masks 19 to in the optical cavity 11 and the placement on the upstream reflector 14 and downstream reflector 15 of a reflective coating 20.

In some embodiments, the method also includes the steps of placing the dispenser 21 in the recess 12*a*.

A glass plate—or wafer—8 is provided, and this is used to close off the recess of the optical cavity 11*a* and the recess of the dispenser cavity 12*a* to form the optical cavity 11 and the dispenser cavity 12 (see diagram (g) of FIG. 9A).

For this purpose, the recess-shaped plate—or wafer—7 and the glass plate—or wafer—8 are placed facing each other and are sealed to one another, in particular by anodic bonding.

Next, the optical cavity is filled with alkali-metal vapour and where appropriate the buffer gas, depending on the chosen process, in particular as indicated with the dispenser 21 in the dispenser cavity 12.

If deflection means 17 and 18, in particular diffraction means, are necessary and provided, they are put together as illustrated by the successive diagrams in FIG. 9B illustrating the successive steps of the method in this respect. In this embodiment, a glass plate—or wafer—8 is provided and the deflection means 17 and 18, in particular diffraction means, are shaped on it.

And, as is illustrated by the successive diagrams of FIG. 9C, one assembles and secures the glass plate—or wafer—provided with deflection means 17 and 18. In particular diffraction means, onto and atop the glass plate—or wafer—that closes off the cell 2 and includes the masks 19.

In one particular embodiment, an etchable silicon plate—or wafer—7 is provided, and, as shown in FIG. 5, this is etched with a pyramid shape along the crystal planes [111] at 54.7° by wet etching so as to form the upstream reflector 14, the downstream reflector 15, and the recess 11*a* of the optical cavity 11. The deviation/diffraction means 17 and 18 are associated with the glass plate—or wafer—8.

In the case where the cell 2 comprises a dispenser cavity 12, the method is such that, as represented in FIG. 9A, said dispenser cavity 12 is formed to be adjacent to the optical cavity 11, the cleared area that will allow the communication 13 between the two cavities 11 and 12 is also created, and the dispenser 12 is placed in the recess 12*a* of the dispenser cavity 12. Then, once the recess-shaped plate—or wafer—7 and the glass plate—or wafer—8 are sealed to each other, heating is performed so that alkali-metal vapour is generated which migrates towards and into the optical cavity 11 via the communication 13 between the two cavities 11 and 12.

The method may also include an operation of associating the cell 2 with optical means 2 for shaping the external input laser beam 5*a*, in particular a quarter-wave plate 22 and a collimating lens 23.

The invention claimed is:

1. An alkali-metal vapour cell, intended in particular for inclusion in an atomic clock, adapted to be associated with a laser for emitting an external input laser beam striking the cell and with a photodetector for receiving an external output laser beam exiting the cell, the laser beam having passed through the cell, said cell comprising, a housing having an upstream optical window and a downstream optical window and forming an optical cavity filled with alkali-metal vapour such as vapour containing cesium, and micro-optical means arranged in the optical cavity and comprising an upstream optical reflector and a downstream optical reflector for reflecting the laser beam, said reflectors being inclined relative to one other, the upstream reflector being inclined relative to the plane of the upstream window and to the axis of the input laser beam, such that: the external input laser beam passes through the upstream window to form an internal input laser beam, the internal input laser beam is reflected on the upstream reflector and deflected towards the downstream reflector to form an internal intermediate laser beam, the internal intermediate laser beam is reflected on the downstream reflector and deflected towards the downstream window to form an internal output laser beam, and the internal output laser beam passes through the downstream window to form the external output laser beam, said cell further comprising upstream deflection means for deflecting the input laser beam, said upstream deflection means being located upstream of the upstream reflector, and downstream deflection means for deflecting the laser beam reflected by the downstream reflector, said downstream deflection means being located downstream of the downstream reflector, so as to combine the deflection produced by the upstream deflection means with the deflection produced by the upstream reflector and to combine the deflection produced by the downstream deflection means with the deflection produced by the downstream reflector.

2. The alkali-metal vapour cell according to claim 1, wherein the upstream reflector and the downstream reflector are arranged symmetrically relative to a transverse midplane of the cell.

3. The alkali-metal vapour cell according to claim 1, wherein the input laser beam and/or the output laser beam forms a 90° angle with the internal intermediate laser beam, and/or the input laser beam and the output laser beam are arranged parallel to one another.

4. The alkali-metal vapour cell according to claim 1, wherein the upstream reflector and the downstream reflector are spaced apart from each other, the spacing between them determining the dimension of the optical cavity and of the cell in the direction of axis of the internal intermediate laser beam.

5. The alkali-metal vapour cell according to claim 4, wherein the spacing between the upstream reflector and the downstream reflector is between about 3 mm and about 9 mm, particularly between about 4 mm and about 8 mm, more particularly between about 5 mm and about 7 mm.

6. The alkali-metal vapour cell according to claim 1, wherein the upstream optical window and the downstream optical window are arranged on one and the same side of the cell, in particular are formed by two portions separated by one and the same glass plate—or wafer.

7. The alkali-metal vapour cell according to claim 1, comprising one and the same side of association with the laser emitting the input laser beam and with the photodetector receiving the output laser beam.

8. The alkali-metal vapour cell according to claim 1, wherein the upstream deflection means, and where appropriate the downstream deflection means, are diffraction means associated with the upstream optical window and where appropriate with the downstream optical window.

9. The alkali-metal vapour cell according to claim 1, wherein the reflectors and the deflection means, in particular the diffraction means, are chosen so as to maintain the circular polarization state of the laser beam during its path.

10. The alkali-metal vapour cell according to claim 1, further comprising, in the optical cavity, one or more masks preventing the passage of the laser beam into unwanted area(s).

11. The alkali-metal vapour cell according to claim 1, wherein the upstream reflector and the downstream reflector are formed by shaping, particularly by etching, a plate—or wafer, and comprise a reflective coating, particularly of metal, more particularly of aluminum.

12. The alkali-metal vapour cell according to claim 1, comprising, in addition to the optical cavity, a dispenser cavity adjacent to and in communication with the optical cavity, suitable for receiving a dispenser of alkali metal such as cesium, the alkali-metal vapour which is generated by heating after sealing the cell migrating towards and into the optical cavity through the communication between the two cavities.

13. The alkali-metal vapour cell according to claim 1, wherein the optical cavity is filled with alkali-metal vapour and a buffer gas.

14. The alkali-metal vapour cell according to claim 1, having associated optical means for shaping the external input laser beam, in particular a quarter-wave plate and a collimating lens.

15. The alkali-metal vapour cell according to claim 1, wherein the housing comprises, on one hand, a shapeable plate—or wafer shaped so as to form the recess of the optical cavity, the upstream reflector, the downstream reflector, if appropriate the recess of the dispenser cavity and the cleared area of the communication between the two cavities, and on the other hand, a glass plate—or wafer so as to form the upstream optical window and the downstream optical window and to close off the optical cavity, where appropriate the dispenser cavity, and with which are associated deflection means, in particular diffraction means, the glass plate—or wafer and the recess-shaped plate—or wafer being arranged opposite each other and sealed to one another, in particular by anodic bonding.

16. The alkali-metal vapour cell according to claim 1, comprising a shapeable plate—or wafer etched so as to form the recess of the optical cavity, the upstream reflector, the downstream reflector, if appropriate the recess of the dispenser cavity and the cleared area of the communication between the two cavities, the upstream reflector and the downstream reflector being etched along the crystal planes of the constituent material of the shapeable plate—or wafer.

17. The alkali-metal vapour cell according to claim 16, comprising a shapeable silicon plate—or wafer, etched with a pyramid shape along the crystal planes [111] at 54.7° so as to form the upstream reflector, the downstream reflector, and the recess of the optical cavity, and, in combination, upstream diffraction means for diffraction towards the adjacent outer edge of the cell and if appropriate downstream diffraction means with an angle of 19.48°.

18. A method for manufacturing an alkali-metal vapour cell according to claim 15, wherein:
a shapeable plate—or wafer—is provided and is shaped to form a recess or recesses, in particular is etched, so as to form the recess of the optical cavity, the upstream reflector, the downstream reflector, if appropriate the recess of the dispenser cavity and the cleared area of the communication between the two cavities,
a glass plate—or wafer—is provided that is suitable for forming the upstream optical window and the downstream optical window and for closing off the optical cavity, if appropriate the cavity dispenser,
the recess-shaped plate—or wafer—and the glass plate—or wafer—are placed facing each other and are sealed to one another, in particular by anodic bonding,
the optical cavity is filled with alkali-metal vapour,
and the glass plate—or wafer—is associated with deflection means, in particular diffraction means.

19. The method for manufacturing an alkali-metal vapour cell according to claim 18, wherein:
an etchable silicon plate—or wafer—is provided, and is etched with a pyramid shape along the crystal planes [111] at 54.7° by wet etching so as to form the upstream reflector, the downstream reflector, and the recess of the optical cavity,
the glass plate—or wafer—is associated with deflection means, in particular diffraction means.

20. The method for manufacturing an alkali-metal vapour cell according to claim 18, wherein a dispenser cavity is formed, adjacent to and in communication with the optical cavity, a dispenser of alkali metal such as cesium is placed in the dispenser cavity, and once the recess shaped plate—or wafer—and the glass plate—or wafer—are sealed to one another, heating is performed so as to generate alkali-metal vapour which migrates towards and into the optical cavity via the communication between the two cavities.

21. The method for manufacturing an alkali-metal vapour cell according to claim 18, comprising at least one of the following operations:
placement of one or more masks in the optical cavity in order to prevent the passage of the laser beam into undesired area(s),
placement on the upstream reflector and downstream reflector of a reflective coating, particularly of metal, more particularly of aluminum,
introduction of a buffer gas into the optical cavity,
association with the alkali-metal vapour cell of optical means for shaping the external input laser beam, in particular a quarter-wave plate and a collimating lens.

22. An atomic clock comprising an alkali-metal vapour cell according to claim 1, associated in a compact manner with a laser for emitting an external input laser beam striking the cell and with a photodetector for receiving an external output laser beam exiting the cell.

23. The atomic clock according to claim 22, wherein the laser for emitting the input laser beam and the photodetector for receiving the output laser beam are associated with the cell on one and the same side of association.

24. The atomic clock according to claim 22, wherein the input laser beam and the output laser beam are arranged parallel to one another, one next to the other.

25. The atomic clock according to claim 22, wherein the laser is a VCSEL vertical cavity laser.

* * * * *